(12) United States Patent
Noguchi et al.

(10) Patent No.: US 10,459,005 B2
(45) Date of Patent: Oct. 29, 2019

(54) EVALUATION APPARATUS FOR SEMICONDUCTOR DEVICE AND EVALUATION METHOD FOR SEMICONDUCTOR DEVICE

(71) Applicant: Mitsubishi Electric Corporation, Tokyo (JP)

(72) Inventors: Takaya Noguchi, Tokyo (JP); Akira Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 309 days.

(21) Appl. No.: 15/204,054

(22) Filed: Jul. 7, 2016

(65) Prior Publication Data

US 2017/0138984 A1 May 18, 2017

(30) Foreign Application Priority Data

Nov. 18, 2015 (JP) ................................. 2015-225475

(51) Int. Cl.
*G01R 31/00* (2006.01)
*G01R 1/04* (2006.01)
(Continued)

(52) U.S. Cl.
CPC ....... *G01R 1/0408* (2013.01); *G01R 1/06722* (2013.01); *G01R 1/07307* (2013.01);
(Continued)

(58) Field of Classification Search
USPC .......................... 324/750.01–754.03, 754.07, 324/754.11–754.13, 750.19
See application file for complete search history.

(56) References Cited

U.S. PATENT DOCUMENTS 4,518,910 A * 5/1985 Hottenrott .......... G01R 1/07357
324/72.5
5,585,736 A * 12/1996 Hshieh ................... G01R 1/067
324/750.03
(Continued)

FOREIGN PATENT DOCUMENTS

CN     1213083 A    4/1999
CN   101278385 A   10/2008
(Continued)

OTHER PUBLICATIONS

An Office Action issued by the Chinese Patent Office dated Nov. 21, 2018, which corresponds to Chinese Patent Application No. 201611023034.8 and is related to U.S. Appl. No. 15/204,054; with English language.
(Continued)

*Primary Examiner* — Vincent Q Nguyen
(74) *Attorney, Agent, or Firm* — Studebaker & Brackett PC

(57) ABSTRACT

An evaluation apparatus for a semiconductor device includes: a chuck stage that has a surface on which a plurality of probe holes are formed and sucks a semiconductor device; and a plurality of in-chuck probes that have first ends which are inserted into the respective probe holes, and second ends which protrude from the surface of the chuck stage, and come into contact with an arrangement surface of the semiconductor device arranged in the chuck stage, wherein a height protruding from the surface of the chuck stage of at least one of the in-chuck probes is different from a height protruding from the surface of the chuck stage of the other in-chuck probe.

28 Claims, 13 Drawing Sheets

(51) Int. Cl.
*G01R 1/067* (2006.01)
*G01R 1/073* (2006.01)
*H01L 21/683* (2006.01)
*H01L 21/687* (2006.01)

(52) U.S. Cl.
CPC .... *H01L 21/6838* (2013.01); *H01L 21/68735* (2013.01); *H01L 21/68757* (2013.01)

(56) References Cited

U.S. PATENT DOCUMENTS

| | | | | |
|---|---|---|---|---|
| 6,066,957 | A * | 5/2000 | Van Loan | G01R 1/07328 324/750.19 |
| 9,110,128 | B1 | 8/2015 | Long | |
| 2002/0097060 | A1 | 7/2002 | Maekawa et al. | |
| 2006/0170434 | A1 * | 8/2006 | Grube | G01B 7/287 324/750.23 |
| 2007/0297118 | A1 * | 12/2007 | Fujii | H01L 21/6833 361/234 |
| 2009/0045829 | A1 * | 2/2009 | Awazu | G01R 31/2865 324/762.05 |
| 2009/0146672 | A1 * | 6/2009 | Nakamura | G01R 1/06722 324/754.03 |
| 2015/0015287 | A1 | 1/2015 | DeBauche et al. | |
| 2015/0168455 | A1 * | 6/2015 | Anraku | C22C 5/04 324/754.03 |
| 2015/0204373 | A1 * | 7/2015 | Wada | B02C 18/18 29/426.1 |
| 2017/0138985 | A1 * | 5/2017 | Teranishi | G01R 1/067 |

FOREIGN PATENT DOCUMENTS

| | | |
|---|---|---|
| CN | 201359614 Y | 12/2009 |
| CN | 101714535 A | 5/2010 |
| CN | 102435798 A | 5/2012 |
| CN | 102749567 A | 10/2012 |
| CN | 103336234 A | 10/2013 |
| DE | 35 29 207 C1 | 3/1987 |
| JP | 05-333098 A | 12/1993 |
| KR | 10-2009-0126572 A | 12/2009 |
| TW | 201512678 A | 4/2015 |

OTHER PUBLICATIONS

An Office Action issued by the Chinese Patent Office dated May 21, 2019, which corresponds to Chinese Patent Application No. 201611023034.8 and is related to U.S. Appl. No. 15/204,054; with English language translation.

* cited by examiner

EVALUATION APPARATUS FOR SEMICONDUCTOR DEVICE AND EVALUATION METHOD FOR SEMICONDUCTOR DEVICE

BACKGROUND OF THE INVENTION

Field of the Invention

The technology disclosed in this specification relates to an evaluation apparatus for a semiconductor device and an evaluation method for a semiconductor device, and relates to, for example, an evaluation apparatus for a semiconductor device and an evaluation method for a semiconductor device for evaluating an electrical characteristic of a semiconductor device by using a plurality of probes.

Description of the Background Art

When an electrical characteristic of a semiconductor device which is in a state of a semiconductor wafer or a state of a semiconductor chip is measured, a method for bringing a single surface of the semiconductor device into contact with a surface of a chuck stage to fix the surface by vacuum suction is generally used.

In a vertical semiconductor device that flows a current in the vertical direction of the semiconductor device, that is, in the out-of-plane direction, the surface of the chuck stage, to which the single surface of the semiconductor device is fixed, becomes one of measuring electrodes. Therefore, adhesion between the semiconductor device and the surface of the chuck stage influences contact resistance, which consequently influences the electrical characteristic of the semiconductor device.

As a factor that causes deterioration of the adhesion between the semiconductor device and the surface of the chuck stage, a case where a foreign substance which is often brought along with the semiconductor device is sandwiched between the semiconductor device and the surface of the chuck stage, or a case where the deterioration is caused by flatness of the semiconductor device itself, for example, a case where the semiconductor wafer is warped, is assumed.

In the case where a foreign substance is sandwiched between the semiconductor device and the surface of the chuck stage, the sandwiched foreign substance influences the electrical characteristic of the semiconductor device. In addition to this, in the case where a foreign substance is sandwiched between the semiconductor device and the surface of the chuck stage, defects such as cracks may occur at a part, in contact with the foreign substance, of the semiconductor device, or in the vicinity of the part, in contact with the foreign substance, of the semiconductor device, and a part of the semiconductor device may be damaged.

For example, Japanese Patent Application Laid-Open No. 05-333098 discloses an evaluation apparatus that reduces a measurement error of an electrode potential that results from a difference of the flatness of the semiconductor wafer.

The evaluation apparatus disclosed in Japanese Patent Application Laid-Open No. 05-333098 includes probe electrodes corresponding to the number of individual power semiconductor elements in a semiconductor wafer support base, so that it is possible to suppress dispersion in horizontal relative distances between the respective power semiconductor elements and the corresponding probe electrodes, and to reduce an measurement error. The probe electrodes are connected to the evaluation apparatus through a selection switch group that is on/off-controlled.

However, the probe electrodes in the semiconductor wafer support base disclosed in Japanese Patent Application Laid-Open No. 05-333098 cannot correspond the warp of the semiconductor wafer, or the foreign substance.

SUMMARY OF THE INVENTION

The technology disclosed in this specification relates to an evaluation apparatus for a semiconductor device and an evaluation method for a semiconductor device capable of corresponding to warp or the like in an arrangement surface of the semiconductor device, and reducing contact resistance.

An evaluation apparatus for a semiconductor device according to an aspect of the technology disclosed in this specification includes: a chuck stage that has a surface on which a plurality of probe holes are formed and sucks a semiconductor device; and a plurality of in-chuck probes that have first ends which are inserted into the respective probe holes, and second ends which protrude from the surface of the chuck stage, and come into contact with an arrangement surface of the semiconductor device arranged in the chuck stage, wherein a height, protruding from the surface of the chuck stage, of at least one of the in-chuck probes is different from a height protruding from the surface of the chuck stage of the other in-chuck probe.

An evaluation method for a semiconductor device according to an aspect of the technology disclosed in this specification includes: performing evaluation using an evaluation apparatus, the evaluation apparatus including: a chuck stage that has a surface on which a plurality of probe holes are formed and sucks a semiconductor device; and a plurality of in-chuck probes that have first ends which are inserted into the respective probe holes, and second ends which protrude from the surface of the chuck stage, and come into contact with an arrangement surface of the semiconductor device arranged in the chuck stage. A height protruding from the surface of the chuck stage of at least one of the in-chuck probes is different from a height protruding from the surface of the chuck stage of the other in-chuck probe.

According to the evaluation apparatus for a semiconductor device according to the aspect of the technology disclosed in this specification, the height protruding from the surface of the chuck stage of at least one of the in-chuck probes is different, and therefore, for example, even when the arrangement surface of the semiconductor device warps, the protruding heights of the in-chuck probes can be made to correspond to the arrangement surface of the semiconductor device. Accordingly, when the electrical characteristic of the semiconductor device is evaluated, it is possible to reduce contact resistance between the arrangement surface of the semiconductor device and the in-chuck probes. As a result, an electric loss is reduced, so that it is possible to improve the evaluation accuracy of the electrical characteristic of the semiconductor device.

According to the evaluation method for a semiconductor device according to the aspect of the technology disclosed in this specification, the heights protruding from the surface of the chuck stage of the in-chuck probes are different, and therefore, even when the arrangement surface of the semiconductor device warps, the protruding heights of the in-chuck probes can be made to correspond to the arrangement surface of the semiconductor device. Accordingly, when the electrical characteristic of the semiconductor device is evaluated, it is possible to reduce contact resistance between the arrangement surface of the semiconductor device and the in-chuck probes.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
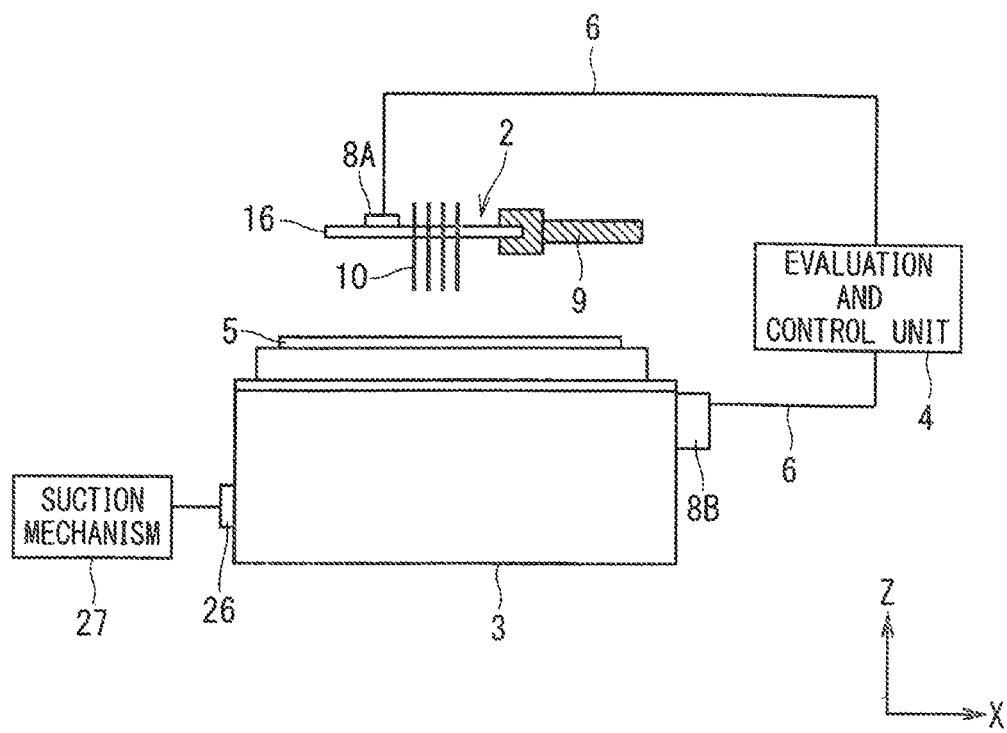
FIG. 1 is a diagram for schematically exemplifying a configuration for implementing an evaluation apparatus for a semiconductor device according to a preferred embodiment.

Hereinafter, a preferred embodiment will be described with reference to the attached drawings. The drawings are schematically shown, and the mutual relation of sizes and positions of images shown in the different drawings are not always accurately exemplified, and can be appropriately changed. Additionally, in the following description, similar components are illustrated by being denoted by the same reference numerals, and names and functions of these components are also similar. Accordingly, detailed description of these components may be omitted.

In the following description, even in a case where words that mean specified positions and directions such as "upper", "lower", "side", "bottom", "front" and "back" are used, these words are used for the sake of convenience in order to facilitate understanding of the contents of the preferred embodiment, and are not related to the direction when actually implemented.

Preferred Embodiment

Hereinafter, an evaluation apparatus for a semiconductor device and an evaluation method for a semiconductor device according to this preferred embodiment will be described.

<Configuration of Evaluation Apparatus>

FIG. 1 is a diagram for schematically exemplifying a configuration for implementing an evaluation apparatus for a semiconductor device according to this preferred embodiment. In FIG. 1, the vertical axis direction is defined as the Z-axis direction, and the horizontal axis direction is defined as the X-axis direction.

As exemplified in FIG. 1, the evaluation apparatus for a semiconductor device includes a chuck stage 3 where a semiconductor device 5 is disposed, a connection part 8B mounted on a side surface of the chuck stage 3, an intake port 26 formed in a side surface of the chuck stage 3, a suction mechanism 27 that sucks the semiconductor device 5 through the intake port 26, a probe base 2, and an evaluation and control unit 4.

The evaluation and control unit 4 is connected to the probe base 2 through a signal line 6. Additionally, the evaluation and control unit 4 is connected to the connection part 8B through the signal line 6.

The probe base 2 includes surface side probes 10 that come into contact with a surface of the semiconductor device 5, an insulating plate 16 that holds the surface side probes 10, a connection part 8A mounted on the insulating plate 16, and a wiring line (not illustrated herein) between each of the surface side probes 10 and the connection part 8A.

Figure 2:
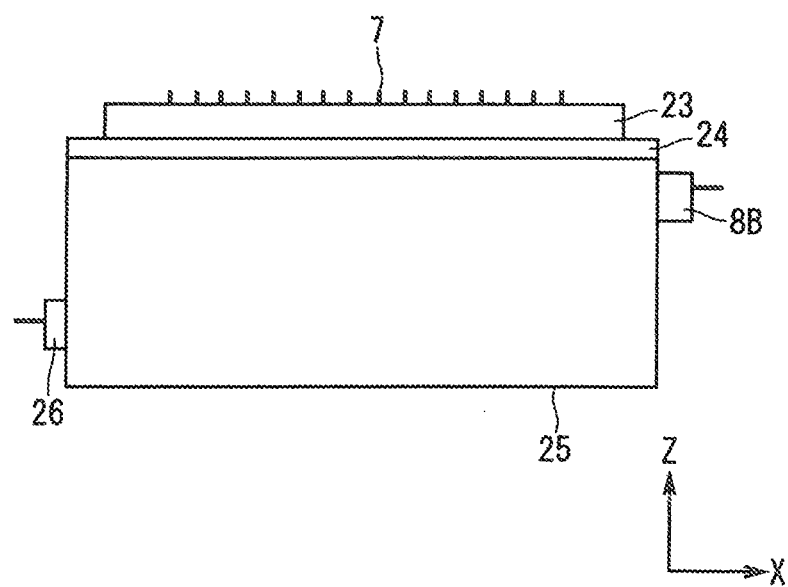
FIG. 2 is a diagram for schematically exemplifying a configuration for implementing a chuck stage according to the preferred embodiment.

FIG. 2 is a diagram for schematically exemplifying a configuration for implementing the chuck stage according to this preferred embodiment. In FIG. 2, the vertical axis direction is defined as the Z-axis direction, and the horizontal axis direction is defined as the X-axis direction.

As exemplified in FIG. 2, the chuck stage includes an outer frame part 25, an inner frame part 24 disposed on an upper surface of the outer frame part 25, a body part 23 disposed on an upper surface of the inner frame part 24, and the in-chuck probes 7. The chuck stage is a pedestal for fixing the semiconductor device 5, which is an object to be measured, to an upper surface of the body part 23. As a fixing method, for example, vacuum suction is assumed.

In a case exemplified in FIG. 2, a plurality of in-chuck probes 7 are arranged in the body part 23 of the chuck stage 3. With such a configuration, it is possible to evaluate an electrical characteristic of the semiconductor device 5, in a state where an arrangement surface of the semiconductor device 5 and the in-chuck probes 7 are in direct contact with each other.

The semiconductor device 5 that is the object to be measured is a vertical semiconductor device that flows a large current in the vertical direction of the semiconductor device 5, that is, in the out-of-plane direction.

A single electrode for allowing the semiconductor device 5 to be electrically connected to the outside when the electrical characteristic of the vertical semiconductor device 5 is evaluated becomes the surface side probes 10 that come into contact with connection pads provided on an upper surface of the semiconductor device 5. Another electrode for allowing the semiconductor device 5 to be electrically connected to the outside becomes the in-chuck probes 7 that come into electric contact with connection pads provided on a lower surface of the semiconductor device 5, that is, an arrangement surface.

The surface side probes 10 are disposed in the insulating plate 16. The insulating plate 16 is mounted with the connection part 8A, and further, the evaluation and control unit 4 is connected to the connection part 8A through the signal line 6. Each surface side probe 10 and the evaluation and control unit 4 are electrically connected to each other. Although not illustrated in detail, for example, each surface side probe 10 and the connection part 8A are electrically connected by a wiring line such as a metal plate provided on the insulating plate 16.

Each of the in-chuck probes 7 is connected to a wiring line inside the chuck stage 3. The connection part 8B is provided on the side surface of the outer frame part 25 of the chuck stage 3, and the wiring line is further connected to the signal line 6 in the connection part 8B. The signal line 6 is connected to the evaluation and control unit 4. Each in-chuck probe 7 and the evaluation and control unit 4 are electrically connected to each other.

In the above case, assuming that a large current (for example, about 5 A or more) is applied, a plurality of the surface side probes 10 are arranged. In this case, the connection part 8A and the connection part 8B are desirably provided at such a position that a wiring line distance between the connection part 8A and the connection part 8B through the each of the surface side probes 10 substantially coincides with a wiring line distance between the connection part 8A and the connection part 8B even through any surface side probe 10, such that the current densities applied to the respective surface side probe 10 substantially coincide with each other. For example, the connection part 8A and the connection part 8B are desirably disposed at such a position as to face each other with the surface side probes 10 interposed therebetween.

The probe base 2 is held by a moving arm 9, so that the probe base can move in the arbitrary direction. Herein, the probe base 2 is held by only one moving arm 9. However, the present invention is not limited to this, and the probe base 2 may be stably held by a plurality of moving arms. Additionally, the probe base 2 may not move, and the semiconductor device 5, that is, the chuck stage 3 side may move.

<Configuration of Chuck Stage>

Figure 5:
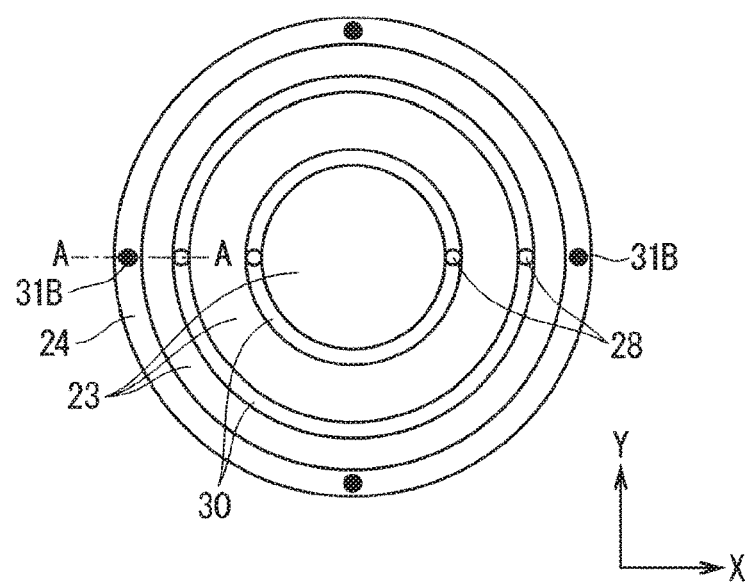
FIG. 5 is a diagram for schematically exemplifying the configuration for implementing the chuck stage according to the preferred embodiment.

FIG. 5 is a plan view for schematically exemplifying the configuration for implementing the chuck stage according to this preferred embodiment. For simplification, illustration of the in-chuck probes is omitted in FIG. 5. In FIG. 5, the vertical axis direction is defined as the Y-axis direction, and the horizontal axis direction is defined as the X-axis direction.

Vacuum suction grooves 30 are formed in an upper surface of the body part 23. Additionally, vacuum suction holes 28 for vacuum suction are formed in a part of a bottom surface of each of the vacuum suction grooves 30. The semiconductor device 5 is vacuum sucked from the vacuum suction holes 28, so that the semiconductor device 5 is fixed to the upper surface of the body part 23.

Herein, the two vacuum suction grooves 30 are concentrically provided. However, an aspect for forming the vacuum suction grooves 30 is not limited to this, and a plurality of the vacuum suction grooves 30 may be further provided. Additionally, the method for fixing the semiconductor device 5 is not limited to vacuum suction. For example, electrostatic suction or the like may be used.

Figure 6:
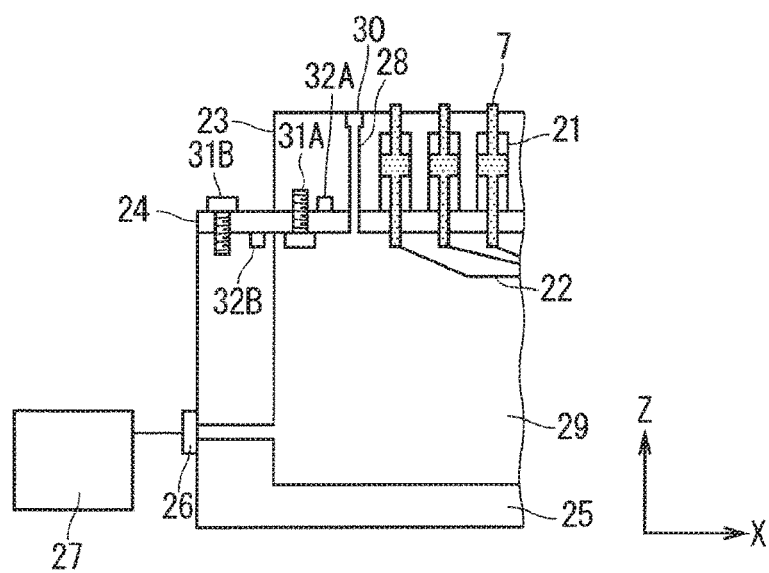
FIG. 6 is a sectional view of the A-A part of the chuck stage according to the preferred embodiment exemplified in FIG. 5.

FIG. 6 is a sectional view of the A-A part of the chuck stage according to this preferred embodiment exemplified in FIG. 5. In FIG. 6, the vertical axis direction is defined as the Z-axis direction, and the horizontal axis direction is defined as the X-axis direction. Hereinafter, a configuration of the chuck stage will be described with reference to FIG. 6.

The body part 23, the inner frame part 24, and the outer frame part 25 each are desirably a rigid body in order to stably fix the semiconductor device 5, and are made, for example, metal, or resin having sufficient strength such as polyphenylene sulfide resin i.e., PPS).

The body part 23 is a housing including probe storage holes 21 storing the in-chuck probes 7, the vacuum suction grooves 30, the vacuum suction holes 28 formed in a part of the bottom surface of each vacuum suction groove 30.

In a case where the body part 23 is made of metal, the respective parts such as the probe storage holes 21 are formed by cutting. Additionally, in a case where the body part 23 is made of resin, the respective parts such as the probe storage holes 21 are simultaneously formed by molding.

In order to hold the in-chuck probes 7, the body part 23 is closed by the inner frame part 24. A connection part 31A connecting the body part 23 and the inner frame part 24 is, for example, a fixing screw. In order to avoid vacuum leakage during vacuum suction of the semiconductor device 5, it is desirable that an O-ring groove 32A is provided in the body part 23, and connection with the inner frame part 24 is connection through the O-ring. However, a method for avoiding vacuum leakage during vacuum suction is not limited to the above connection through the O-ring, and may be, for example, connection through a copper packing.

The inner frame part 24 is connected to the outer frame part 25. Connection parts 31B connecting the inner frame part 24 and the outer frame part 25 are, for example, fixing screws. In order to avoid vacuum leakage during vacuum suction of the semiconductor device 5, it is desirable that an O-ring groove 32B is provided in the outer frame part 25, and connection with the inner frame part 24 is performed through the O-ring. In FIG. 5, the four connection parts 31B are disposed. However, the number of the connection parts 31B may further increase, and avoiding of the vacuum leakage may be strengthened.

Inside of the outer frame part 25 is a hollow suction space 29. The suction space 29 is a space decompressed when the semiconductor device 5 is sucked. The suction space 29 is provided with a plurality of wiring lines 22. The plurality of wiring lines 22 serve as electrical connection parts of the respective in-chuck probes 7 and the evaluation and control unit 4 provided outside the chuck stage 3.

The vacuum suction holes 28 are formed to penetrate the body part 23 and the inner frame part 24 up to the suction space 29 that is the inside of the chuck stage 3. Then, the vacuum suction holes 28 are connected to the suction mechanism 27, specifically, a regulator or a vacuum source, through the intake port 26 provided in the side surface of the outer frame part 25.

Figure 7:
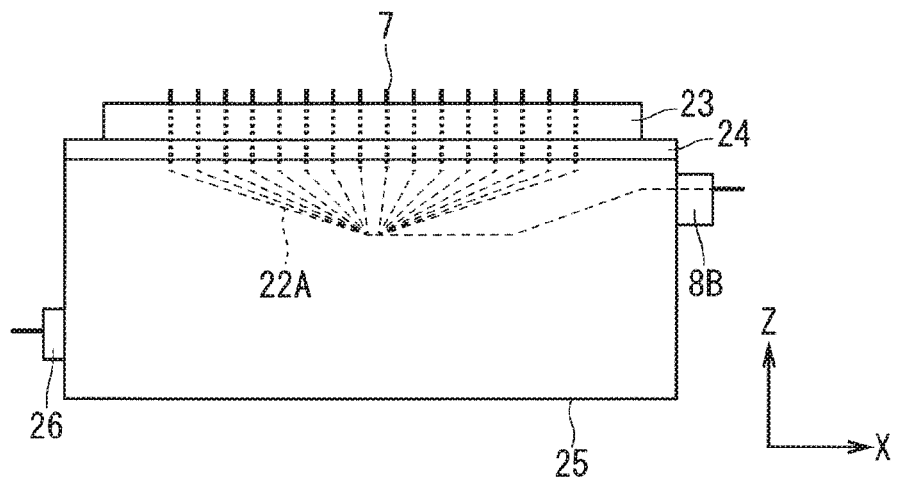
FIGS. 7 and 8 are transparent views for exemplifying a state of wiring lines in the chuck stage according to the preferred embodiment.

FIG. 7 is a transparent view for exemplifying a state of wiring lines in the chuck stage according to this preferred embodiment. In FIG. 7, the vertical axis direction is defined as the Z-axis direction, and the horizontal axis direction is defined as the X-axis direction.

In a case where the respective wiring lines 22A connected to the in-chuck probes 7 are connected to the connection part 8B, when the respective lengths of the wiring lines 22A are different, different voltage drops in response to the lengths of the wiring lines 22A occur in respective semiconductor chips provided inside the semiconductor device 5. The different voltage drops occur in the respective semiconductor chips, so that a measurement error occurs. Therefore, in order to maintain measuring accuracy, the respective lengths of the wiring lines 22A are desirably unified to some extent.

The wiring lines 22A exemplified in FIG. 7 are concentrated at a single place in the vicinity of the center of the suction space 29, and the concentrated wiring lines 22A are further connected to the connection part 8B. With such a configuration, dispersion of the voltage drops can be reduced compared to a case where the respective wiring lines 22A are individually connected to the connection part 8B.

Figure 8:
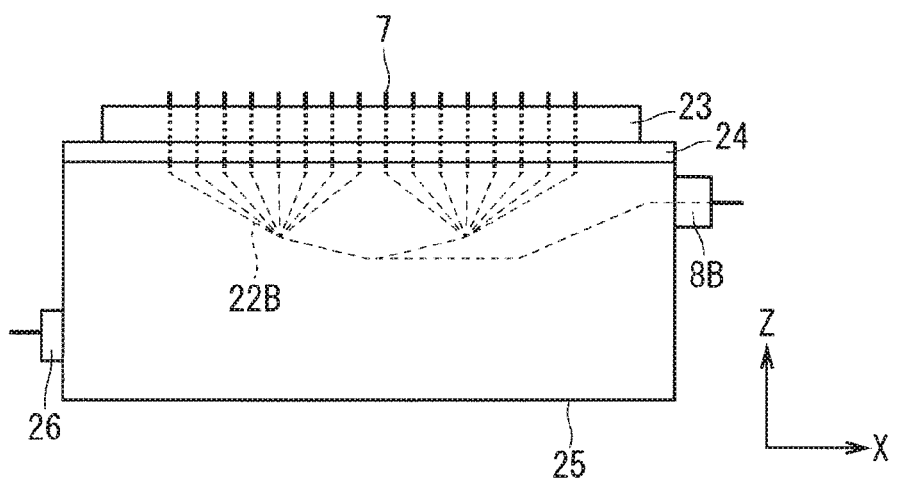

FIG. 8 is a transparent view for exemplifying a state of the wiring lines in the chuck stage according to this preferred embodiment. In FIG. 8, the vertical axis direction is defined as the Z-axis direction, and the horizontal axis direction is defined as the X-axis direction.

The wiring lines 22B exemplified in FIG. 8 are different from the wiring lines 22A exemplified in FIG. 7, and a plurality of places where the wiring lines 22B are concentrated are provided. In the case exemplified in FIG. 8, the number of the places where the wiring lines 22B are concentrated is two. Then, the wiring lines 22B concentrated at the two places are further concentrated at a single place in the vicinity of the center of the suction space 29, and the concentrated wiring lines 22B are connected to the connection part 8B. With such a configuration, compared to the case exemplified in FIG. 7, the respective lengths of the wiring lines 22B are further unified, and therefore it is possible to reduce dispersion in voltage drops.

Figure 25:
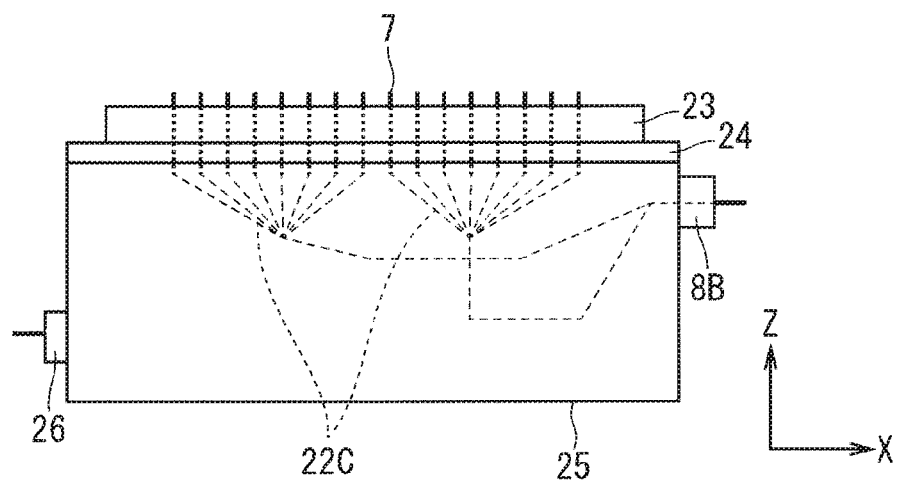
FIG. 25 is a transparent view for exemplifying a state of wiring lines in the chuck stage according to the preferred embodiment.

FIG. 25 is a transparent view for exemplifying a state of the wiring lines in the chuck stage according to the preferred embodiment. In FIG. 25, the vertical axis direction is defined as the Z-axis direction, and the horizontal axis direction is defined as the X-axis direction.

The wiring lines 22C exemplified in FIG. 25 are different from the wiring lines 22A exemplified in FIG. 7, and a plurality of places where the wiring lines 22C are concentrated are provided. In the case exemplified in FIG. 25, the number of the places where the wiring lines 22C are concentrated is two. Then, the lengths of the wiring lines from the concentrated places of the wiring lines 22C concentrated at the two places up to the connection part 8B are substantially the same. With such a configuration, compared to the case exemplified in FIG. 7, the respective lengths of the wiring lines 22C are further unified, and therefore it is possible to reduce dispersion in voltage drops.

Although not exemplified in each of the above drawings, in order to evaluate the electrical characteristic of the semiconductor device in a case where a temperature changes, for example, a temperature rising mechanism such as a heater may be provided in the suction space 29 of the chuck stage 3. In a case where the temperature rising mechanism is provided, when thermal conductivity is considered, each part of the chuck stage 3, particularly, the body part 23 and the inner frame part 24 are desirably metal materials. On the other hand, in a case where each part of the chuck stage 3, particularly, the body part 23 and the inner frame part 24 are resin materials, the body part 23 and the inner frame part 24 do not have electrical conductivity. Therefore, when the electrical characteristic of the semiconductor device 5 is evaluated, it is possible to prevent current flow-round to other semiconductor chip.

<Configuration of Surface Side Probe>

Figure 3:
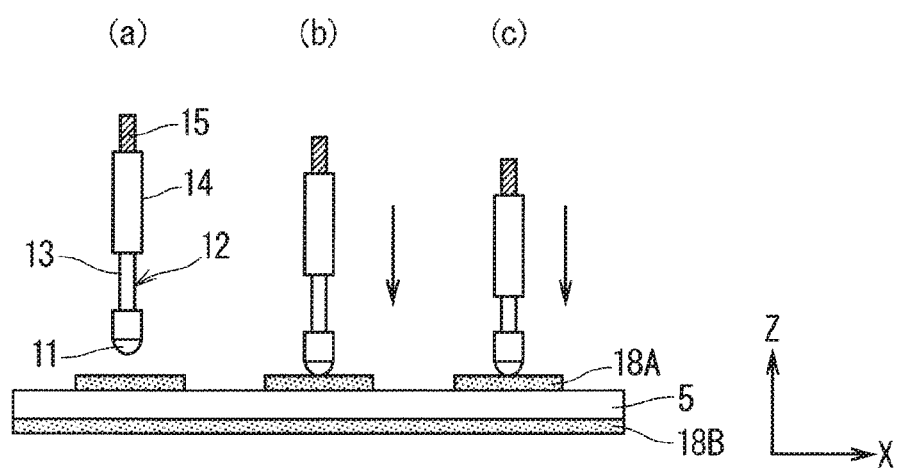
FIG. 3 is a diagram for exemplifying a configuration of the surface side probe and a peripheral part of the surface side probe in the evaluation apparatus for a semiconductor device according to the preferred embodiment exemplified in FIG. 1.

FIG. 3 is a diagram for exemplifying a configuration of the surface side probe and the peripheral part of the surface side probe in the evaluation apparatus for a semiconductor device according to this preferred embodiment exemplified in FIG. 1. Part (a) of FIG. 3 is a diagram for exemplifying a stage before the surface side probe and the upper surface of the semiconductor device come into contact with each other, part (h) of FIG. 3 is a diagram for exemplifying a stage where the surface side probe and the upper surface of the semiconductor device come into contact with each other, and part (c) of FIG. 3 is a diagram for exemplifying a stage where the surface side probe and the upper surface of the semiconductor device come into contact with each other, and the surface side probe is further pushed. In FIG. 3, the vertical axis direction is defined as the Z-axis direction, and the horizontal axis direction is defined as the X-axis direction. With reference to FIG. 3, the surface side probe will be described.

Each of the surface side probes 10 includes a barrel part 14 that is in contact with the insulating plate 16, a contact part 11 that mechanically and electrically comes into contact with a connection pad 18A provided on the surface of the semiconductor device 5, a plunger parts 12, and an electric connection part 15.

A surface of the contact part 11 has a protruding shape toward the connection pads 18A. However, the shape of the surface of the contact part 11 is not limited to this, and may have, for example, a planar shape.

The plunger part 12 is a member having an end mounted with the contact part 11. Additionally, an end, opposite to the end mounted with the contact part 11 of the plunger part 12 is inserted into the barrel part 14. The plunger part 12 has a push-in part 13. The push-in part 13 is a member capable of extending and contracting in the direction in which the barrel part 14 and the contact part 11 are connected by a spring material such as an incorporated spring.

The electric connection part 15 is electrically connected to the plunger parts 12 inside the barrel part 14. Additionally, the electric connection part 15 becomes an output end to the outside of the surface side probe 10.

The surface side probe 10 for evaluation is made of, for example, a metal material such as copper, tungsten and rhenium tungsten, having conductivity. However, the metal material is not limited to these. Particularly, the contact part 11 may be covered with another member, for example, gold, palladium, tantalum or platinum, from the point of view of improvement of conductivity or improvement of durability.

Operation of the surface side probes 10 will be described with reference to FIG. 3.

The surface side probes 10 descend toward the connection pads 18A provided on the surface of the semiconductor device 5 in the downward direction of the Z-axis, from a state of part (a) of FIG. 3. Then, as exemplified in part (b) of FIG. 3, the connection pads 18A come into contact with the contact parts 11.

Thereafter, when the surface side probes 10 further descend, the push-in parts 13 are pushed in the barrel parts 14 through spring members as exemplified in part (c) of FIG. 3. The surface side probes 10 are brought into such a state, so that contact between the connection pads 18A on the surface of the semiconductor device 5 and the surface side probes 10 are secured.

Herein, the push-in parts 13 have the spring members that extend and contract in the Z-axis direction, inside the push-in parts 13. However, the push-in parts 13 are not limited to such an aspect, and may have, for example, spring members outside the push-in parts 13. Additionally, the push-in parts 13 are not limited to spring type members, but may be cantilever type members, stacked probes, wire probes, or the like.

<Configuration of in-Chuck Probe>

Figure 4:
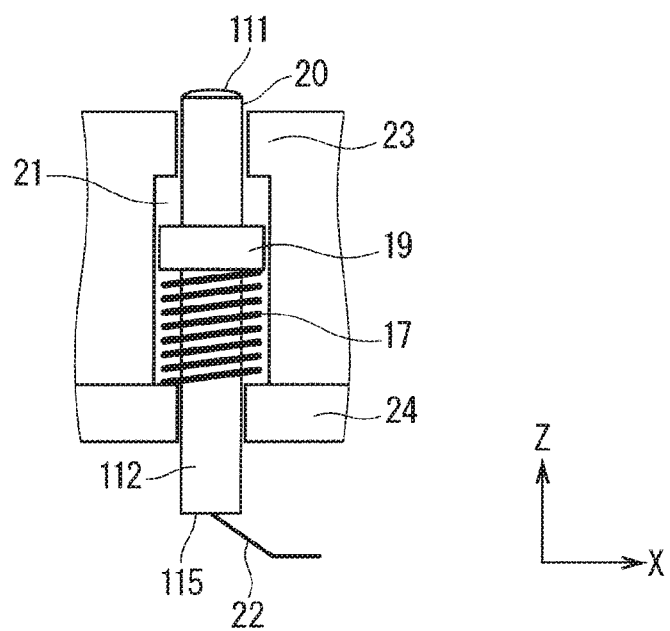
FIG. 4 is a diagram for exemplifying a configuration of an in-chuck probe and a peripheral part of the in-chuck probe in the evaluation apparatus for a semiconductor device according to the preferred embodiment exemplified in FIG. 1.

FIG. 4 is a diagram for exemplifying a configuration of the in-chuck probe and the peripheral part of the in-chuck probe in the evaluation apparatus for a semiconductor device according to this preferred embodiment exemplified in FIG. 1. In FIG. 4, the vertical axis direction is defined as the Z-axis direction, and the horizontal axis direction is defined as the X-axis direction. The in-chuck probes according to this preferred embodiment will be described with reference to FIG. 4.

The in-chuck probes 7 are inserted into the probe storage holes 21 provided in the body part 23 of the chuck stage 3. In each of the probe storage holes 21, the inner diameter in the vicinity of the surface of the body part 23 is smaller than the inner diameter of a part other than the part in the vicinity of the surface of the body part 23.

Each in-chuck probe 7 includes a contact part 111 that comes into mechanical and electric contact with a connection pad 18B provided on the arrangement surface of the semiconductor device 5, a plunger part 112, an electric connection part 115, and a spring part 17.

The in-chuck probe 7 does not have a component corresponding to the barrel part 14. This is because the probe storage hole 21 can be substituted. It is not necessary to provide the barrel part, and therefore it is possible to reduce the number of components.

The plunger part 112 is a member having an end mounted with the contact part 111. The plunger part 112 has a plunger thick part 19 at a middle part in the longitudinal direction. The plunger thick part 19 is a part having a larger diameter than other parts in the longitudinal direction of the plunger part 112. The diameter of the plunger thick part 19 is larger than the inner diameter in the vicinity of the surface of the body part 23 of the probe storage hole 21. Therefore, the plunger thick part 19 is caught by a part having a small diameter of the probe storage hole 21, so that the plunger part 112 is prevented from getting out of the surface of the body part 23.

The spring part 17 is disposed along the longitudinal direction of the plunger part 112, and has a first end that comes into contact with the plunger thick part 19, and a second end that comes into contact with the inner frame part 24. The spring part 17 extends and contracts along the longitudinal direction of the plunger part 112, so that the plunger thick part 19 moves. Consequently, the in-chuck probe 7 can move in the longitudinal direction of the plunger part 112. The wiring line 22 is connected at an end protruding inside the suction space 29 of the plunger part 112 by soldering or the like.

An end on a side in which the contact part 111 is mounted of the plunger parts 112 is located so as to protrude from the surface of the body part 23. A part protruding from the surface of the body part 23 of the plunger part 112 is a plunger protruding part 20.

The length in the longitudinal direction of the plunger part 112 of the plunger protruding part 2 is set to about 0.5 mm, but is variable as described later.

A surface of the contact part 111 has a protruding shape toward the semiconductor device 5. The surface of the contact parts 111 is formed in such a shape, so that also in a case where the arrangement surface of the semiconductor device 5 is not planar, it is possible to attain electric contact without one-side hitting of the in-chuck probe 7. However, the shape of the surface of the contact part 111 is not limited to this, but may be, for example, a planar shape as exemplified in FIG. 11, which will be later described.

When the semiconductor device 5 is arranged in the body part 23, and vacuum suction is performed, the spring parts 17 contract with adhesion between the semiconductor device 5 and the body part 23. Then, electric connection and mechanical connection between the connection pads 18B of the semiconductor device 5 and the in-chuck probes 7 are secured.

Figure 11:
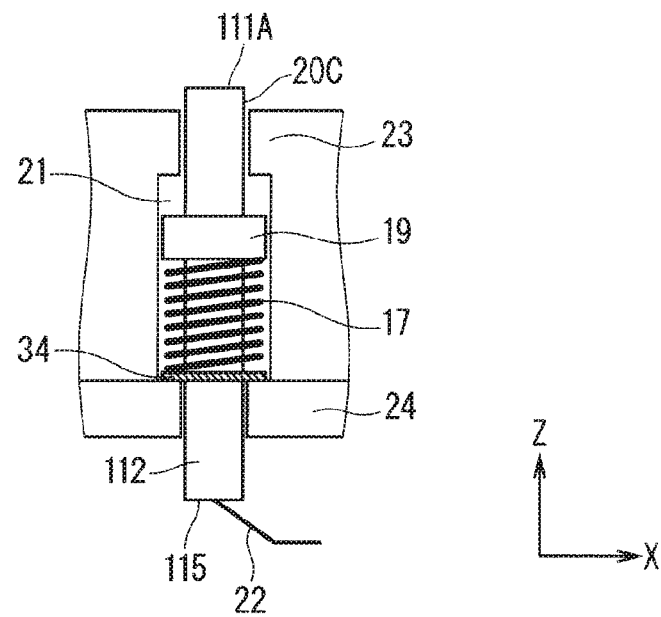

FIG. 11 is a diagram for exemplifying a configuration of an in-chuck probe and the peripheral part of the in-chuck probe in the evaluation apparatus for a semiconductor device according to this preferred embodiment. In FIG. 11, the vertical axis direction is defined as the Z-axis direction, and the horizontal axis direction is defined as the X-axis direction.

As exemplified in FIG. 11, a surface of a contact part 111A has a planar shape, so that a contact area between the contact part 111A and a connection pads 18B increases. Accordingly, it is possible to suppress heat generation at the time of applying a large current.

Figure 9:
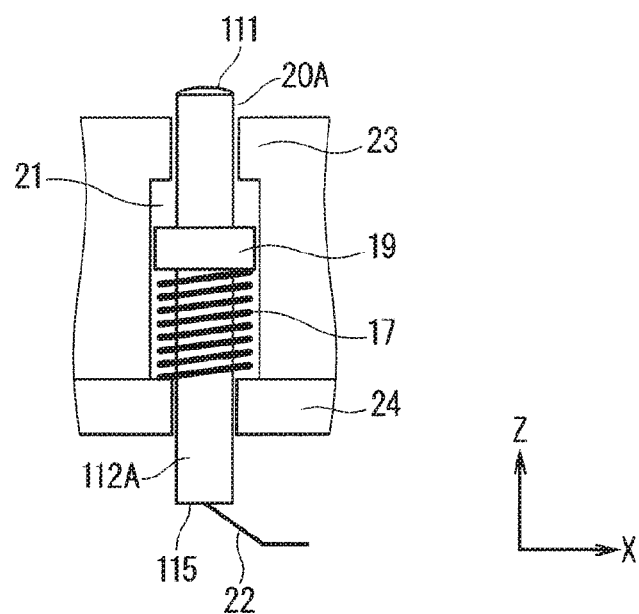
FIGS. 9, 10, 11, 12, 13, 14, and 15 are diagrams for exemplifying a configuration of an in-chuck probe and the peripheral part of the in-chuck probe in the evaluation apparatus for a semiconductor device according to the preferred embodiment.

FIG. 9 is a diagram for exemplifying a configuration of an in-chuck probe and the peripheral part of the in-chuck probe in the evaluation apparatus for a semiconductor device according to this preferred embodiment. In FIG. 9, the vertical axis direction is defined as the Z-axis direction, and the horizontal axis direction is defined as the X-axis direction.

As exemplified in FIG. 9, the length on a side closer to a contact part 111 than a plunger thick part 19 of a plunger part 112A is changed, so that it is possible to change the length in the longitudinal direction of the plunger part 112A of a plunger protruding part 20A.

Figure 10:
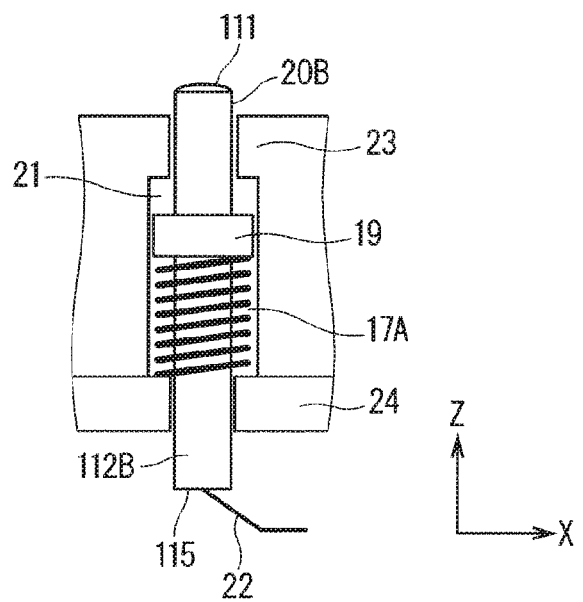

FIG. 10 is a diagram for exemplifying a configuration of an in-chuck probe and the peripheral part of the in-chuck probe in the evaluation apparatus for a semiconductor device according to this preferred embodiment. In FIG. 10, the vertical axis direction is defined as the Z-axis direction, and the horizontal axis direction is defined as the X-axis direction.

As exemplified in FIG. 10, the length on a side closer to an electric connection part 115 than a plunger thick part 19 of a plunger part 112B is changed, so that it is possible to change the length in the longitudinal direction of the plunger part 112B of a plunger protruding part 20B. With the change in the length on the side closer to the electric connection part 115 than the plunger thick part 19 of the plunger part 112B, the length in the longitudinal direction of the plunger part 112B of a spring part 17A is also appropriately changed.

FIG. 11 is a diagram for exemplifying a configuration of an in-chuck probe and the peripheral part of the in-chuck probe in the evaluation apparatus for a semiconductor device according to this preferred embodiment. In FIG. 11, the vertical axis direction is defined as the Z-axis direction, and the horizontal axis direction is defined as the X-axis direction.

In the in-chuck probe exemplified in FIG. 11, a spacer 34 is provided between the spring part 17 and the inner frame part 24. With such a configuration, it is possible to change the length in the longitudinal direction of a plunger part 112 of a plunger protruding part 20C. The position where the spacer 34 is provided is not limited to the case exemplified in FIG. 11, but may be, for example, a position between the spring part 17 and a plunger thick part 19. Additionally, the spacers 34 may be provided between the spring part 17 and the inner frame part 24 and between the spring part 17 and the plunger thick part 19. The thickness of the spacer 34 is changed, so that the length in the longitudinal direction of the plunger part 112 of the plunger protruding part 20C can be freely changed.

Figure 12:
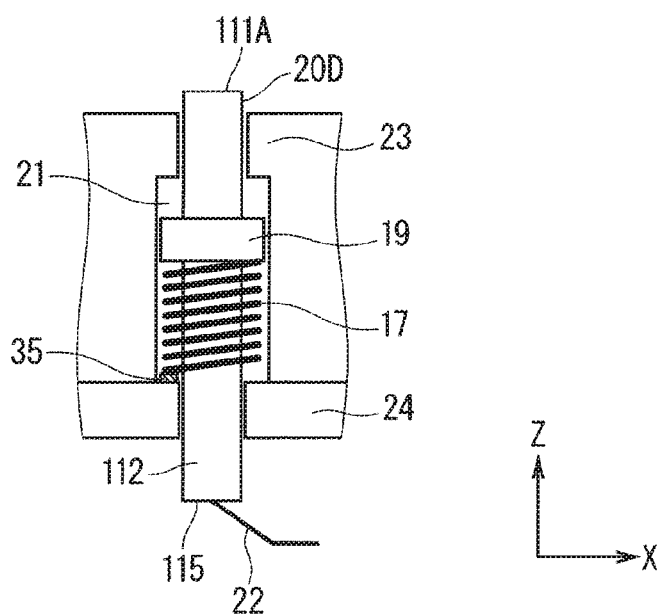

FIG. 12 is a diagram for exemplifying a configuration of an in-chuck probe and the peripheral part of the in-chuck probe in the evaluation apparatus for a semiconductor device according to this preferred embodiment. In FIG. 12, the vertical axis direction is defined as the Z-axis direction, and the horizontal axis direction is defined as the X-axis direction.

The in-chuck probe exemplified in FIG. 12 includes a contact protruding part 35 between the spring part 17 and the inner frame part 24. With such a configuration, it is possible to change the length in the longitudinal direction of a plunger part 112 of a plunger protruding part 20D. Herein, the contact protruding part 35 is different from the above described spacer 34, and it is enough to provide the contact protruding part 35 only in the vicinity of a place where the spring part 17 comes into contact with the inner frame part 24. In a case where the inner frame part 24 is made metal, it is generally difficult to process the surface of the inner frame part 24 in a state where the contact protruding part 35 remains. Therefore, after the processing of other components including the inner frame part 24 is finished, the contact protruding part 35 is desirably mounted by an adhesive or the like. Additionally, the contact protruding part 35 receives mechanical pressure by extension and contraction of the spring part 17, and therefore is desirably made of metal such as stainless steel which is hardly worm.

Figure 13:
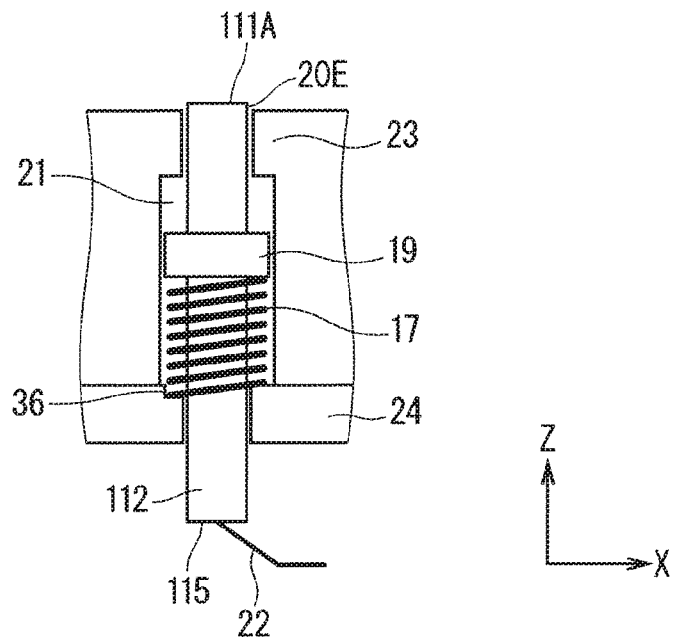

FIG. 13 is a diagram for exemplifying a configuration of an in-chuck probe and the peripheral part of the in-chuck probe in the evaluation apparatus for a semiconductor device according to this preferred embodiment. In FIG. 13, the vertical axis direction is defined as the Z-axis direction, and the horizontal axis direction is defined as the X-axis direction.

The in-chuck probes exemplified in FIG. 13 includes a contact recessed part 36 between the spring part 17 and the inner frame part 24. With such a configuration, it is possible to change the length, in the longitudinal direction of a plunger part 112 of a plunger protruding part 20E. Herein, the contact recessed part 36 is different from the above described spacer 34, and it is enough to provide the contact recessed part 36 only in the vicinity of a place where the spring part 17 comes into contact with the inner frame part 24. In a case where the inner frame part 24 is made of metal, the contact recessed part 36 can be made by a counterboring process.

Figure 14:
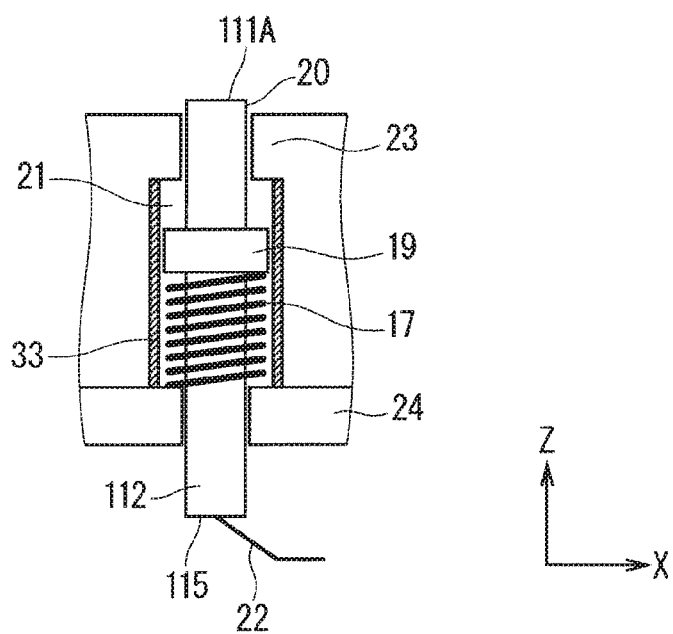

FIG. 14 is a diagram for exemplifying a configuration of an in-chuck probe and the peripheral part of the in-chuck probe in the evaluation apparatus for a semiconductor device according to this preferred embodiment. In FIG. 14, the vertical axis direction is defined as the Z-axis direction, and the horizontal axis direction is defined as the X-axis direction.

In the in-chuck probes exemplified in FIG. 14, a metal cylindrical member 33 is provided along an inner wall of the probe storage hole 21. In a case where a body part 23 is made of an insulating resin material, the inner wall of the probe storage hole 21 is easily damaged and worn by movement of a plunger parts 112 in the longitudinal direction, compared to a case where the body part 23 is made of metal. Therefore, the shape of the probe storage hole 21 itself may be changed.

In the case exemplified in FIG. 14, in order to suppress the shape of the probe storage hole 21 itself from changing, the cylindrical member 33 is provided in the inner wall of the probe storage hole 21. The cylindrical member 33 can be made by rounding a metal plate material. After the body part 23 is made, the cylindrical member 33 is fitted into the probe storage hole 21, so that the cylindrical member 33 can be installed.

Figure 15:
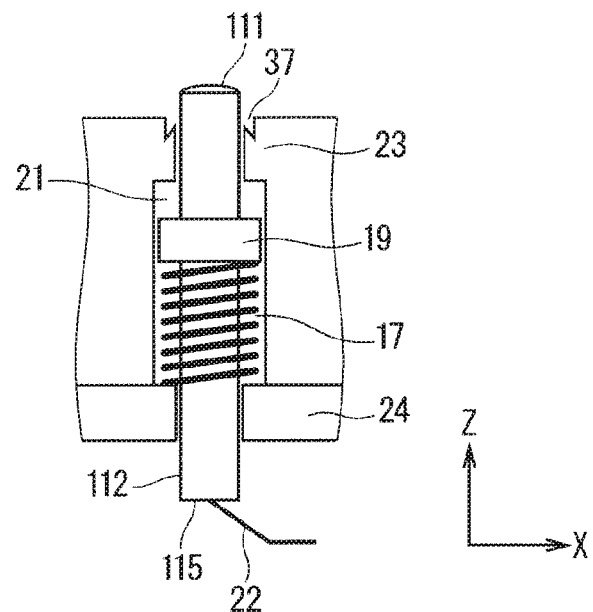

FIG. 15 is a diagram for exemplifying a configuration of an in-chuck probe and the peripheral part of the in-chuck probe in the evaluation apparatus for a semiconductor device according to this preferred embodiment. In FIG. 15, the vertical axis direction is defined as the Z-axis direction, and the horizontal axis direction is defined as the X-axis direction.

In the in-chuck probe exemplified in FIG. 15, each counterbored part 37 is provided around the probe storage hole 21 in the surface of the body part 23.

When a foreign substance is sandwiched between the arrangement surface of the semiconductor device 5 and the surface of a chuck stage 3, the foreign substance influences the electrical characteristic of the semiconductor device. In addition to this, in the case where a foreign substance is sandwiched between the semiconductor device 5 and the surface of the chuck stage 3, a defect such as a crack may occur at a part, in contact with the foreign substance of the semiconductor device 5, or in the vicinity of the part, in contact with the foreign substance, of the semiconductor device 5, and a part of the semiconductor device 5 may be damaged. Additionally, a foreign substance may be bitten between the plunger part 112 and the probe storage hole 21.

In order to avoid such a problem, the counterbored part 37 is provided. The counterbored part 37 is provided, so that a foreign substance which exists around at least the in-chuck probe 7 is housed in the counterbored part 37. Accordingly, it is possible to suppress an influence on the electrical characteristic of the semiconductor device 5 by the foreign substance, and it is also possible to suppress damage to the semiconductor device 5.

Herein, the counterbored part 37 is tapered such that a bottom surface lowers toward radially outside for the purpose of preventing a foreign substance from being bitten between the probe storage hole 21 and the side surface of the plunger part 112.

Figure 16:
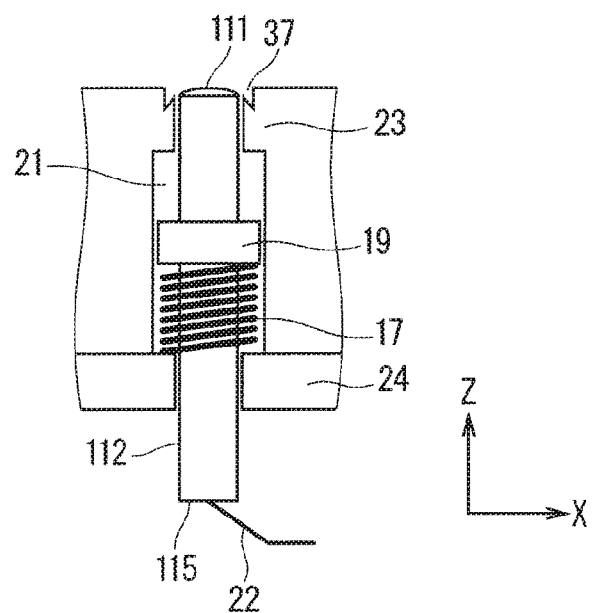
FIG. 16 is a diagram for exemplifying a state where a plunger part is pushed in of the in-chuck probe exemplified in FIG. 15.

FIG. 16 is a diagram for exemplifying a state where the plunger part 112 is pushed in of the in-chuck probe exemplified in FIG. 15. In FIG. 16, the vertical axis direction is defined as the Z-axis direction, and the horizontal axis direction is defined as the X-axis direction. For simplification, illustration of the semiconductor device is omitted in FIG. 16.

In the state exemplified in FIG. 16, the plunger part 112 is pushed in a position where the periphery of a contact part 111 having a protruding shape is continuous to the bottom surface of the counterbored part 37. Thus, the foreign substance moves in the tapered downward direction, and therefore biting of the foreign substance between the probe storage hole 21 and the side surface of the plunger part 112 is effectively suppressed.

Figure 17:
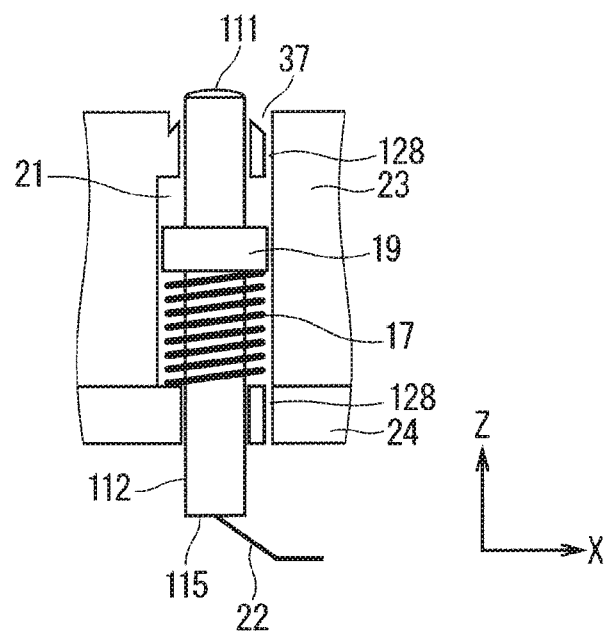
FIG. 17 is a diagram for exemplifying a configuration of an in-chuck probe and the peripheral part of the in-chuck probe in the evaluation apparatus for a semiconductor device according to the preferred embodiment.

FIG. 17 is a diagram for exemplifying a configuration of an in-chuck probe and the peripheral part of the in-chuck probe in the evaluation apparatus for a semiconductor device according to this preferred embodiment. In FIG. 17, the vertical axis direction is defined as the Z-axis direction, and the horizontal axis direction is defined as the X-axis direction.

The in-chuck probe exemplified in FIG. 17 is provided with a counterbored suction hole 128 at least a part of the counterbored part 37.

Figure 18:
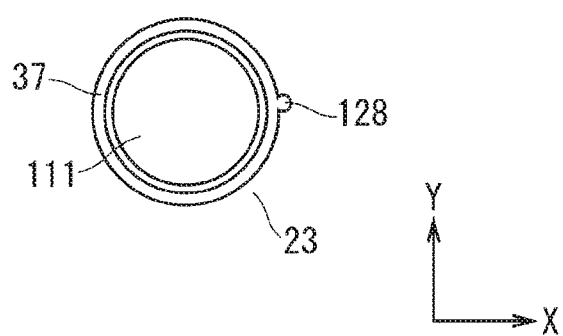
FIG. 18 is a diagram for exemplifying a configuration of the in-chuck probe exemplified in FIG. 17.

FIG. 18 is a diagram for exemplifying a configuration of the in-chuck probe exemplified in FIG. 17. In FIG. 18, the vertical axis direction is defined as the Y-axis direction, and the horizontal axis direction is defined as the X-axis direction.

The counterbored suction hole 128 is formed to be continuous to the counterbored part 37, so that the semiconductor device 5 can be fixed by suction and a foreign substance can be discharged at the same time. That is, suction force in the vicinity of the in-chuck probes 7 is improved by the counterbored suction hole 128, so that contact between the in-chuck probe 7 and the semiconductor device 5 is secured.

Along with the above, the counterbored part 37 is formed, so that at least a foreign substance which exists around the in-chuck probe 7 is housed in the counterbored part 37. Accordingly, it is possible to suppress an influence on the electrical characteristic of the semiconductor device 5.

Figure 19:
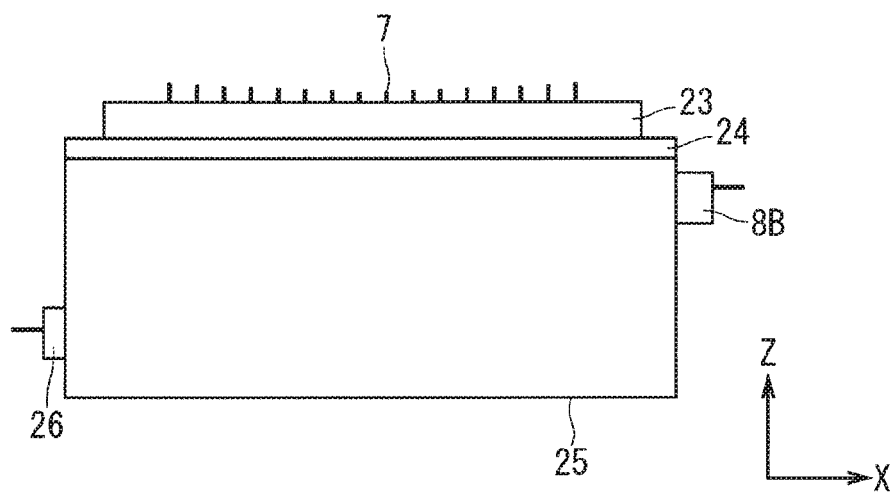
FIGS. 19, 20, 21, and 22 diagrams for schematically exemplifying a distribution of the heights or the location of the in-chuck probes.

FIG. 19 is a diagram for schematically exemplifying a distribution of the heights or the location of the in-chuck probes. In FIG. 19, the vertical axis direction is defined as the Z-axis direction, and the horizontal axis direction is defined as the X-axis direction.

In the example exemplified in FIG. 2, the in-chuck probes 7 are randomly distributed while allowing about ±0.2 mm on the basis of the lengths in the longitudinal directions of the plunger parts 112 of the plunger protruding parts 20 of about 0.5 mm.

On the other hand, in the distribution example exemplified in FIG. 19, the lengths in the longitudinal directions of the plunger parts 112 of the plunger protruding parts 20 are changed such that any of the in-chuck probes can come into contact with the semiconductor device 5 having the arrangement surface whose flatness locally changes.

Specifically, in the distribution example exemplified in FIG. 19, the lengths in the longitudinal directions of the plunger parts 112 of the plunger protruding parts 20 at the peripheral part of the chuck stage 3 are longer than the lengths in the longitudinal directions of the plunger parts 112 of the plunger protruding parts 20 in other region of the chuck stage 3. In the example exemplified in FIG. 19, a case where the in-chuck probes 7 suitably comes into contact with a semiconductor device having an arrangement surface which protrudes downward is assumed.

Figure 20:
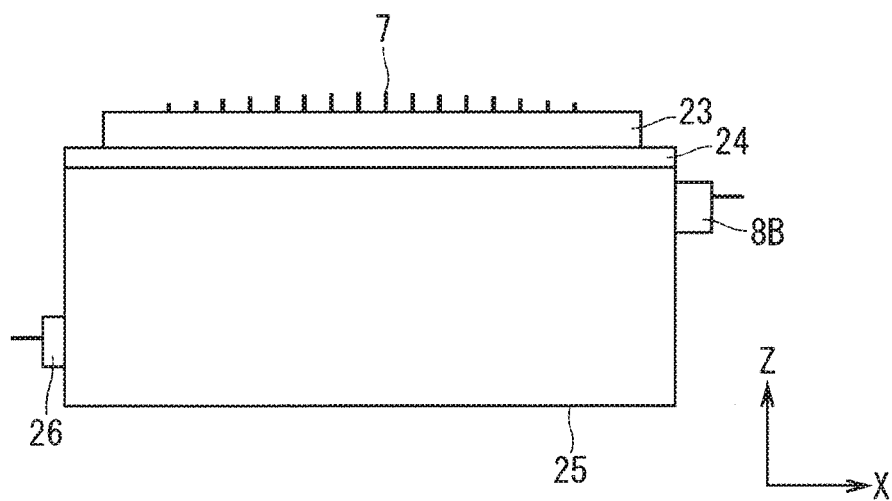

FIG. 20 is a diagram for schematically exemplifying a distribution of the heights or the location of the in-chuck probes. In FIG. 20, the vertical axis direction is defined as the Z-axis direction, and the horizontal axis direction is defined as the X-axis direction.

In the distribution example exemplified in FIG. 20, the lengths in the longitudinal directions of the plunger parts 112 of the plunger protruding parts 20 at the peripheral part of the chuck stage 3 are shorter than the lengths in the longitudinal directions of the plunger parts 112 of the plunger protruding parts 20 in other region of the chuck stage 3. In the example exemplified in FIG. 20, a case where the in-chuck probes 7 suitably comes into contact with a semiconductor device having an arrangement surface which protrudes upward is assumed.

Figure 21:
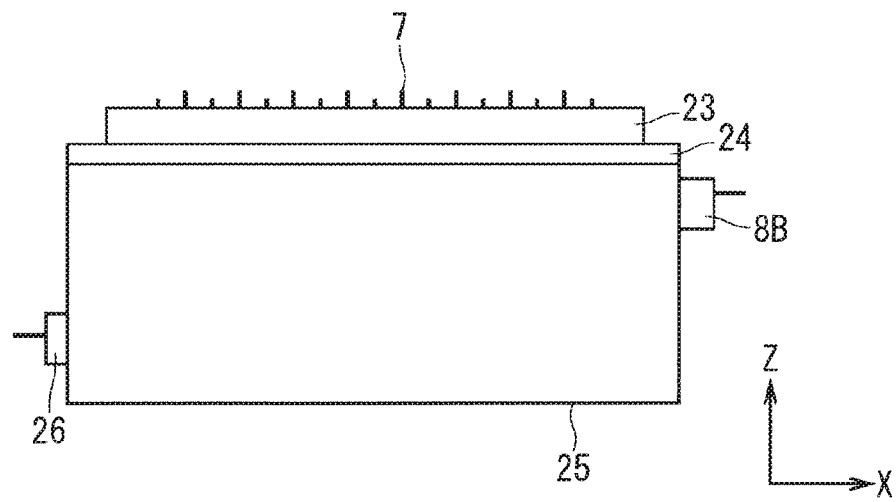

FIG. 21 is a diagram for schematically exemplifying a distribution of the heights or the location of the in-chuck probes. In FIG. 21, the vertical axis direction is defined as the Z-axis direction, and the horizontal axis direction is defined as the X-axis direction.

In the distribution example exemplified in FIG. 21, the lengths in the longitudinal directions of the plunger parts 112 of the plunger protruding parts 20 are concentrically alternately different. In the example exemplified in FIG. 21, a case where any of the in-chuck probes 7 comes into contact with a semiconductor device having locally changing flatness is assumed.

Figure 22:
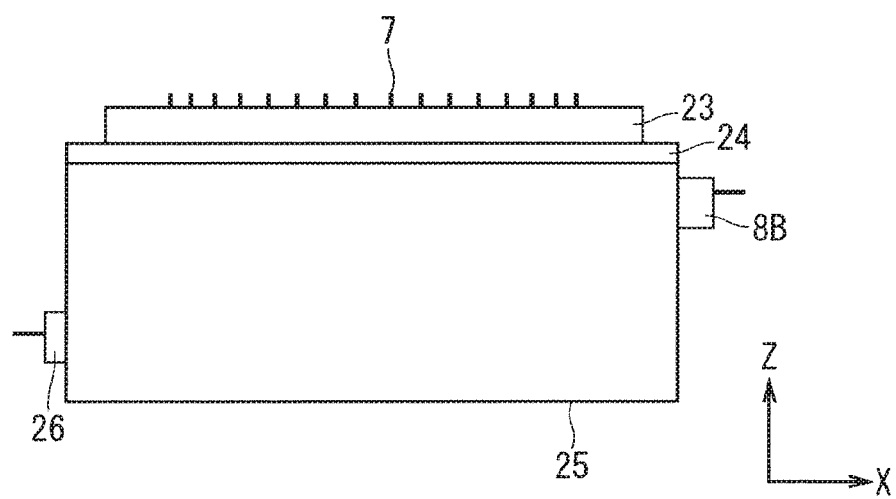

FIG. 22 is a diagram for schematically exemplifying a distribution of the heights or the location of the in-chuck probes. In FIG. 22, the vertical axis direction is defined as the Z-axis direction, and the horizontal axis direction is defined as the X-axis direction.

In the distribution example exemplified in FIG. 22, an in-plane distribution of the in-chuck probes 7 is changed such that the in-chuck probes 7 are densely distributed in the vicinity of the outer periphery of the chuck stage 3. In the example exemplified in FIG. 22, a case where the in-chuck probes 7 reliably come into contact with the semiconductor device 5 at the outer peripheral part of the semiconductor device 5 relatively largely influenced by a foreign substance is assumed.

The distribution of the heights or location of the in-chuck probes 7 is not limited to the cases exemplified in these figures, and includes a case of combining the several examples, for example, the lengths in the longitudinal directions of the plunger parts 112 of the plunger protruding parts 20 changes as exemplified in FIG. 19, in the in-plane distribution of the in-chuck probes 7 exemplified in FIG. 22.

<Aspect of in-Chuck Probes>

Figure 23:
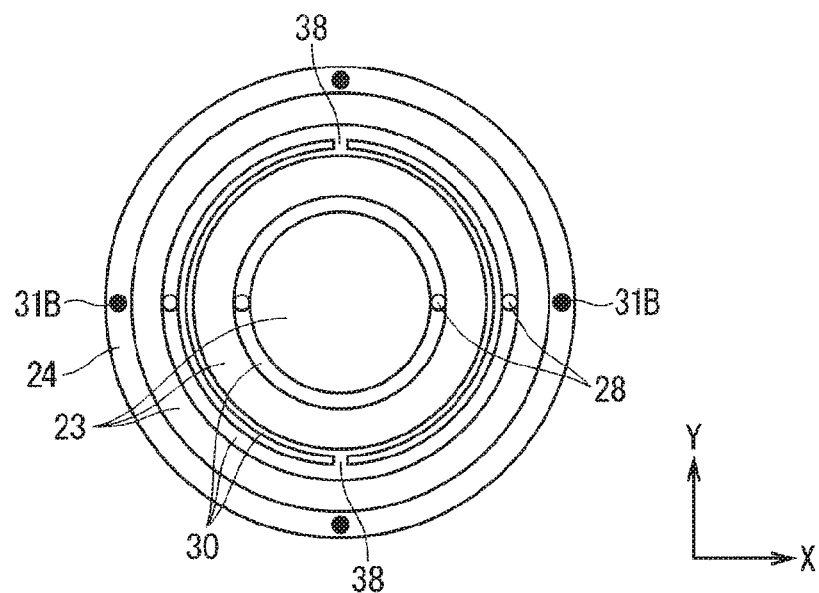
FIGS. 23 and 24 are plan views for schematically exemplifying a configuration of a chuck stage.

FIG. 23 is a plan view for schematically exemplifying a configuration of a chuck stage. For simplification, illustration of the in-chuck probes is omitted in FIG. 23. In FIG. 23, the vertical axis direction is defined as the Y-axis direction, and the horizontal axis direction is defined as the X-axis direction.

In the example exemplified in FIG. 5, a plurality of the vacuum suction grooves 30 individually provided are formed with the respective vacuum suction holes 28. On the other hand, in FIG. 23, vacuum suction holes 28 are not arranged in all vacuum suction grooves 30, and vacuum suction grooves 30 that do not have vacuum suction holes 28, and vacuum suction grooves 30 that have vacuum suction holes 28 are connected by the connecting grooves 38.

The connecting grooves 38 connects the plurality of vacuum suction grooves 30, so that it is possible to reduce the number of the vacuum suction holes 28. Accordingly, it is possible to reduce the manufacturing cost of the evaluation apparatus.

Additionally, as exemplified in FIG. 23, the vacuum suction grooves 30 are densely disposed at the outer periphery of the surface of the chuck stage 3, so that in-chuck probes 7 can suitably come into contact with a semiconductor device having an arrangement surface which protrudes downward.

Figure 24:
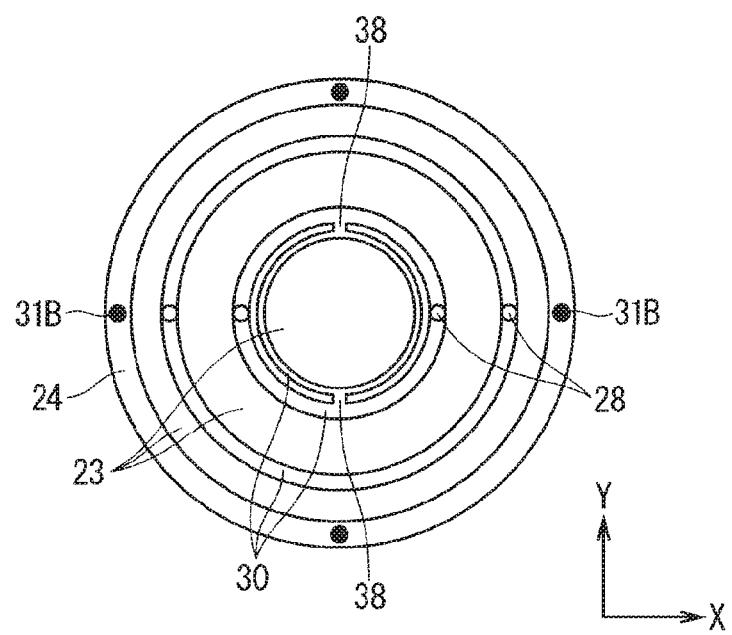

FIG. 24 is a plan view for schematically exemplifying a configuration of a chuck stage. For simplification, illustration of the in-chuck probes is omitted in FIG. 24. In FIG. 24, the vertical axis direction is defined as the Y-axis direction, and the horizontal axis direction is defined as the X-axis direction.

As exemplified in FIG. 24, vacuum suction grooves 30 are densely disposed at the central part of the surface of the chuck stage 3, so that in-chuck probes 7 can suitably come into contact with a semiconductor device having an arrangement surface which protrudes upward.

The number of the vacuum suction grooves 30 or the location of the vacuum suction grooves 30, and the number of the vacuum suction holes 28 or the location of the vacuum suction holes 28 are not limited to these examples. For example, the vacuum suction grooves 30 may be equally disposed, and the respective vacuum suction grooves 30 may be connected by the connecting grooves 38.

<Operation of Evaluation Apparatus>

Now, the operation procedure of the evaluation apparatus for a semiconductor device according to this preferred embodiment will be described.

In a case where the evaluation apparatus for a semiconductor device has the plurality of surface side probes 10, before the electrical characteristic of the semiconductor device is evaluated, the parallelism of the contact parts 11 of the surface side probes 10 is previously made uniform. That is, the length of the push-in parts 13 in the Z-axis direction are previously made uniform.

The lengths in the longitudinal directions of the plunger parts 112 of the plunger protruding parts 20 are adjusted such that the plunger protruding parts 20 of the in-chuck probes 7 can suitably come into contact corresponding to the aspect of the arrangement surface of the semiconductor device 5, the electrical characteristic of which is to be evaluated, that is, warp or curl of the arrangement surface.

The semiconductor device 5 is arranged on the chuck stage 3 such that the arrangement surface of the semiconductor device 5 comes into contact with the chuck stage 3, that is, the arrangement surface of the semiconductor device 5 comes into contact with the plunger protruding parts 20 of the in-chuck probes 7. Then, the semiconductor device 5 is adhered to be fixed onto the chuck stage 3 by vacuum suction.

As the semiconductor device 5, for example, a semiconductor wafer configured by a plurality of semiconductor chips, or a semiconductor chip itself is considered. However, the semiconductor device is not limited to these, any semiconductor device that is fixed on the chuck stage 3 by vacuum suction or the like may be used.

After the semiconductor device 5 is fixed on the chuck stage 3, the surface side probes 10 are brought into contact with the connection pads 18A. Then, the desired electrical characteristic of the semiconductor device 5 is evaluated.

Effects

Hereinafter, effects of the above preferred embodiment will be exemplified. Hereinafter, effects based on specific configurations exemplified in the above preferred embodiment are described. However, in a range in which similar effects are produced, replacement by other specific configuration exemplified in this specification may be allowed.

According to the preferred embodiment, the evaluation apparatus for a semiconductor device includes the chuck stage 3, and the plurality of in-chuck probes 7.

The chuck stage 3 has a surface on which a plurality of probe holes are formed and sucks the semiconductor device 5.

Herein, the probe storage holes 21 correspond to the probe holes.

The in-chuck probes 7 have first ends that are inserted into the respective probe storage holes 21, and second ends that protrude from the surface of the chuck stage 3, and comes into contact with the arrangement surface of the semiconductor device 5 arranged in the chuck stage 3.

Additionally, the height protruding from the surface of the chuck stage 3 of at least one of the in-chuck probes 7 is different from the height protruding from the surface of the chuck stage 3 of other in-chuck probes 7.

According to such a configuration, the height protruding from the surface of the chuck stage 3 of at least one of the in-chuck probes 7 is different, and therefore, for example, even when the arrangement surface of the semiconductor device 5 warps, the heights protruding from the surface of the chuck stage 3 of the in-chuck probes 7 can be made to correspond to the arrangement surface of the semiconductor device 5. Accordingly, when the electrical characteristic of the semiconductor device 5 is evaluated, it is possible to reduce contact resistance between the arrangement surface of the semiconductor device 5 and the in-chuck probes 7. As a result, an electric loss is reduced, so that it is possible to improve the evaluation accuracy of the electrical characteristic of the semiconductor device 5.

Other configurations exemplified in this specification other than these configurations can be appropriately omitted. That is, only these configurations can produce the above effect. However, even in a case where at least one of the other configurations exemplified in this specification is appropriately added to the above configuration, that is, even in a case where the other configuration exemplified in this specification, which is not described as the above configuration, is added to the above configuration, it is possible to produce the above effect similarly.

According to the above preferred embodiment, the heights protruding from the surface of the chuck stage 3 of the in-chuck probes 7 at the peripheral part of the chuck stage 3 are higher than the heights protruding from the surface of the chuck stage 3 of the in-chuck probes 7 at the other part of the chuck stage 3.

According to such a configuration, the arrangement surface of the semiconductor device 5 having a warped shape protruding downward with respect to the chuck stage 3 can be suitably brought into contact with the in-chuck probes 7.

According to the above preferred embodiment, the heights protruding from the surface of the chuck stage 3 of the in-chuck probes 7 at the peripheral part of the chuck stage 3 is lower than the heights, protruding from the surface of the chuck stage 3 of the in-chuck probes 7 at the other parts of the chuck stage 3.

According to such a configuration, the arrangement surface of the semiconductor device 5 having a warped shape protruding upward with respect to the chuck stage 3 can be suitably brought into contact with the in-chuck probes 7.

According to the above preferred embodiment, the heights protruding from the surface of the chuck stage 3 of the in-chuck probes 7 are different in accordance with a distance from the center on the chuck stage 3.

According to such a configuration, the arrangement surface of the semiconductor device 5 having locally changing flatness can be suitably brought into contact with the in-chuck probes 7.

According to the above preferred embodiment, the in-chuck probes 7 are equally disposed on the chuck stage 3.

According to such a configuration, the arrangement surface of the semiconductor device 5 can be equally brought into contact with the in-chuck probes 7.

According to the above preferred embodiment, the in-chuck probes 7 at the peripheral part of the chuck stage 3 are more densely disposed than the in-chuck probes 7 at the other part of the chuck stage 3.

According to such a configuration, it is possible to suitably bring the in-chuck probes 7 into contact at the peripheral part of the arrangement surface of the semiconductor device 5 which is considered to be largely influenced by a foreign substance.

Additionally, it is possible to suitably correspond to the size or the like of a semiconductor element produced in the semiconductor device 5.

According to the above preferred embodiment, the chuck stage 3 is formed of a metal member.

According to such a configuration, when the temperature characteristic of the semiconductor device 5 is evaluated, the temperature can be suitably raised from the chuck stage 3 side.

According to the above preferred embodiment, the chuck stage 3 is formed of resin member.

According to such a configuration, it is suppress current flow-round to other element when the electrical characteristic of the semiconductor device 5 is evaluated.

According to the above preferred embodiment, the evaluation apparatus for a semiconductor device further includes the metal cylindrical members 33, each of the metal cylindrical members 33 being formed at least a part of an inner wall of each of the probe storage holes 21.

According to such a configuration, it is possible to suppress wear and damage to the inner walls of the probe storage holes 21.

According to the above preferred embodiment, each chuck probe 7 includes the rod-shaped plunger part 112, and the spring part 17 provided along the plunger part 112.

Each plunger part 112 has the plunger thick part 19 having a larger diameter than other part. Each spring part 17 has a first end that comes into contact with the plunger thick part 19, and a second end that comes into contact with a bottom of the probe storage hole 21.

According to such a configuration, the spring parts 17 extend and contract, so that the plunger parts 112 can move in the longitudinal direction. Therefore, the in-chuck probes 7 can be suitably brought into contact corresponding to the shape of the arrangement surface of the semiconductor device 5.

According to the above preferred embodiment, the length of at least one of the spring parts 17A is different from the lengths of the other spring parts 17A.

According to such a configuration, the length of at least one of the spring parts 17A is different from the lengths of the other spring parts 17A, so that the in-chuck probes 7 can be suitably brought into contact corresponding to the shape of the arrangement surface of the semiconductor device 5.

According to the above preferred embodiment, the length of at least one of the plunger parts 112A is different from the lengths of the other plunger parts 112A.

According to the above preferred embodiment, the length of at least one of the plunger parts 112B is different from the lengths of the other plunger parts 112B.

According to such a configuration, the length of at least one of the plunger parts is different from the lengths of the other plunger parts, so that the in-chuck probes 7 can be suitably brought into contact corresponding to the shape of the arrangement surface of the semiconductor device 5.

According to the above preferred embodiment, in each of the plunger thick parts 19, a position provided in the longitudinal direction of the plunger part is changeable.

According to such a configuration, the positions provided in the longitudinal directions of the plunger parts of the plunger thick parts 19 are changed, so that positions in the longitudinal direction of the plunger parts at parts coming into contact with the upper ends of the spring parts are changed. Therefore, it is possible to adjust the heights protruding from the surface of the chuck stage 3 of the in-chuck probes 7.

According to the above preferred embodiment, the evaluation apparatus for a semiconductor device further includes spacers 34, each of the spacers 34 being disposed in an end or both ends of the spring part 17.

According to such a configuration, each of the spacers 34 is provided in the end or the both ends of the spring part 17, so that it is possible to adjust the heights protruding from the surface of the chuck stage 3 of the in-chuck probes 7.

According to the above preferred embodiment, the contact parts 111 provided in ends coming into contact with the semiconductor device 5 of the plunger parts have protruding shapes.

According to such a configuration, even in a case where the arrangement surface of the semiconductor device 5 is not planar, the in-chuck probes 7 can come into electric contact without one-side hitting.

According to the above preferred embodiment, the contact parts 111A provided in ends coming into contact with the semiconductor device 5 of the plunger parts have planar shapes.

According to such a configuration, it is possible to increase a contact area of the plunger part with the arrangement surface of the semiconductor device 5, and therefore it is possible to suppress heat generation also when a large current is applied.

According to the above preferred embodiment, an end, opposite to the end coming into contact with the semiconductor device 5 of each of the plunger parts 112 is electrically connected to the external wiring line 22.

According to such a configuration, the wiring lines 22 are directly connected to the plunger parts 112, and therefore generation of contact resistance is suppressed on the structure of the probes.

According to the above preferred embodiment, a plurality of the wiring lines 22A are concentrated at a single place below the chuck stage 3.

According to such a configuration, the lengths of the wiring lines 22A are unified to some extent, so that it is possible to suppress ununiform voltage drops to maintain measuring accuracy.

According to the above preferred embodiment, a plurality of the wiring lines 22B are concentrated at a plurality of places below the chuck stage 3, and thereafter further concentrated at a single place.

According to such a configuration, the lengths of the wiring lines 22B are unified to some extent, so that it is possible to suppress ununiform voltage drops to maintain measuring accuracy.

According to the above preferred embodiment, the evaluation apparatus for a semiconductor device includes counterbored parts 37 formed to surround the probe storage holes 21 in plan view, in the surface of the chuck stage 3.

According to such a configuration, the counterbored parts 37 are provided, so that foreign substances that exist at least around the in-chuck probes 7 are housed in the counterbored parts 37. Accordingly, it is possible to suppress the influence on the electrical characteristic of the semiconductor device 5 by foreign substances, and to suppress damage to the semiconductor device 5 as well.

According to the above preferred embodiment, a bottom of each of the counterbored parts 37 has such a tapered shape as to deepen as separated from the probe storage hole 21.

According to such a configuration, foreign substances can be prevented from being bitten between the probe storage holes 21 and the side surfaces of the plunger parts 112.

According to the above preferred embodiment, the chuck stage 3 includes body part 23, the inner frame part 24, and the outer frame part 25.

The body part 23 corresponds to the surface of the chuck stage 3. The inner frame part 24 corresponds to bottoms of the probe storage holes 21 formed in the surface of the chuck stage 3.

The outer frame part 25 has hollow inside and is connected to the inner frame part 24.

According to such a configuration, it is possible to suppress vacuum leakage during suction with a simple structure.

Additionally, the suction mechanism 27, specifically, a regulator, a vacuum source or the like is connected to the outer frame part 25, so that adhesion and contact properties between the semiconductor device and the in-chuck probes 7 can be secured by vacuum suction in addition to the semiconductor device's own weight.

According to the above preferred embodiment, the evaluation apparatus for a semiconductor device includes counterbored suction holes 128.

Each of the counterbored suction holes 128 is formed at least a part of the bottom of the counterbored part 37. Additionally, each counterbored suction hole 128 penetrates the body part 23 and the inner frame part 24.

According to such a configuration, the counterbored suction holes 128 are formed to be continuous to the counterbored parts 37, so that the semiconductor device 5 can be fixed by suction and a foreign substance can be discharged at the same time. That is, suction force in the vicinity of the in-chuck probes 7 is improved by the counterbored suction holes 128, so that contact between the in-chuck probe 7 and the semiconductor device 5 is secured.

Along with the above, the counterbored parts 37 are formed, so that at least foreign substances existing around the in-chuck probes 7 are housed in the counterbored parts 37. Accordingly, it is possible to suppress an influence on the electrical characteristic of the semiconductor device 5.

Additionally, the number of the vacuum suction grooves 30 can be reduced by replacing the vacuum suction grooves 30 formed in the surface of the chuck stage 3, and therefore the degree of freedom at positions where the in-chuck probes 7 are arranged is improved.

According to the above preferred embodiment, the evaluation apparatus for a semiconductor device includes a plurality of suction grooves, and suction holes. Herein, vacuum suction grooves 30 correspond to the suction grooves. Additionally, the vacuum suction holes 28 correspond to the suction holes.

The vacuum suction grooves 30 are formed in the surface of the chuck stage 3. At least one of the vacuum suction holes 28 is formed in a bottom surface of each of the vacuum suction grooves 30. Additionally, the vacuum suction holes 28 penetrate the body part 23 and the inner frame part 24.

According to such a configuration, compared to a case where the semiconductor device 5 is sucked by the plurality of vacuum suction holes 28 without forming the vacuum suction grooves 30, it is possible to reduce the number of the vacuum suction holes 28. Accordingly, it is possible to reduce a manufacturing cost.

According to the above preferred embodiment, a plurality of the suction grooves 30 are connected at at least one portion.

According to such a configuration, compared to a case where the vacuum suction grooves 30 are not connected, and the vacuum suction holes 28 are formed in the respective vacuum suction grooves 30, it is possible to reduce the number of the vacuum suction holes 28. Accordingly, it is possible to reduce a manufacturing cost.

According to the above preferred embodiment, the vacuum suction grooves 30 at the peripheral part of the chuck stage 3 are more densely disposed than the vacuum suction grooves 30 at the other part of the chuck stage 3.

According to such a configuration, it is possible to suitably suck the arrangement surface of the semiconductor device 5 having a warped shape protruding downward with respect to the chuck stage 3. Accordingly, the in-chuck probes 7 can be suitably brought into contact with the arrangement surface of the semiconductor device 5.

According to the above preferred embodiment, the vacuum suction grooves 30 at the peripheral part of the chuck stage 3 are more coarsely disposed than the vacuum suction grooves 30 at the other part of the chuck stage 3.

According to such a configuration, it is possible to suitably suck the arrangement surface of the semiconductor device 5 having a warped shape protruding upward with respect to the chuck stage 3. Accordingly, the in-chuck probes 7 can be suitably brought into contact with the arrangement surface of the semiconductor device 5.

According to the above preferred embodiment, an evaluation method for a semiconductor device includes performing evaluation using an evaluation apparatus, the evaluation apparatus including the chuck stage 3 that has a surface on which a plurality of the probe storage holes 21 are formed and sucks the semiconductor device 5, and a plurality of the in-chuck probes 7 that have first ends that are inserted into the respective probe storage holes 21, and second ends that protrude from the surface of the chuck stage 3, and come into contact with an arrangement surface of the semiconductor device arranged in the chuck stage 3, wherein a height protruding from the surface of the chuck stage 3 of at least one of the in-chuck probes 7 is different from heights protruding from the surface of the chuck stage 3 of the other in-chuck probes 7.

According to such a configuration, the height protruding from the surface of the chuck stage 3 of at least one of the in-chuck probes 7 is different, and therefore, for example, even when the arrangement surface of the semiconductor device 5 warps, the heights protruding from the surface of the chuck stage 3 of the in-chuck probes 7 can be made to correspond to the arrangement surface of the semiconductor device 5. Accordingly, when the electrical characteristic of the semiconductor device 5 is evaluated, it is possible to reduce contact resistance between the arrangement surface of the semiconductor device 5 and the in-chuck probes 7. As a result, an electric loss is reduced, so that it is possible to improve the evaluation accuracy of the electrical characteristic of the semiconductor device 5.

Other configurations exemplified in this specification other than these configurations can be appropriately omitted. That is, only these configurations can produce the above effect. However, even in a case where at least one of the other configurations exemplified in this specification is appropriately added to the above configuration, that is, even in a case where the other configuration exemplified in this specification, which is not described as the above configuration, is added to the above configuration, it is possible to produce the above effect similarly.

Modification

In the above preferred embodiment, the quality of a material, the material, the size, the shape, the relative positional relation, the implementation condition, or the like of each component is sometimes described. However, these are exemplifications in all aspects, and are not limited to those described in this specification. Accordingly, countless modifications that are not exemplified are assumed within a range of the technology disclosed in this specification. For example, in a case where at least one component is modified, an addition case or an omission case is included.

As long as inconsistency does not occur, a component described as "one" component provided in the above preferred embodiment may be "at least one" component provided. Furthermore, each component is a conceptual unit, which includes a case where one component is composed of a plurality of structures, a case where one component corresponds to a part of a certain structure, and a case where a plurality of components are included in one structure. Additionally, each component includes a structure having other structure or shape, as long as the same function is exhibited.

The description in this specification is referred for all the purposes related to this technology, and is not recognized as a conventional technology.

Additionally, in the above preferred embodiment, in a case where a material name or the like which is not particularly specified is described, it is assumed that the material contains, for example, alloy or the like containing other additive as long as inconsistency does not occur.

While the invention has been shown and described in detail, the foregoing description is in all aspects illustrative and not restrictive. It is therefore understood that numerous modifications and variations can be devised without departing from the scope of the invention.

What is claimed is:

1. An evaluation apparatus for a semiconductor device comprising:
    a chuck stage that has a surface on which a plurality of probe holes are formed and sucks a semiconductor device; and
    a plurality of in-chuck probes that have first ends which are inserted into the respective probe holes, and second ends which protrude from said surface of said chuck stage in a direction normal to said surface of said chuck stage, and come into contact with an arrangement surface of said semiconductor device arranged in said chuck stage, wherein
    maximum extendable protrusion heights from said surface of said chuck stage of said in-chuck probes monotonically change with a distance from a center of said surface of said chuck stage to a peripheral part of said surface of said chuck stage.

2. The evaluation apparatus for a semiconductor device according to claim 1, wherein
    heights protruding in said normal direction from said surface of said chuck stage of said in-chuck probes at said peripheral part of said surface of said chuck stage are higher than heights protruding from said surface of said chuck stage of said in-chuck probes at a part of said surface of said chuck stage other than said peripheral part.

3. The evaluation apparatus for a semiconductor device according to claim 1, wherein
    heights protruding in said normal direction from said surface of said chuck stage of said in-chuck probes at said peripheral part of said surface of said chuck stage are lower than heights protruding from said surface of said chuck stage of said in-chuck probes at a part of said surface of said chuck stage other than said peripheral part.

4. The evaluation apparatus for a semiconductor device according to claim 1, wherein
    heights protruding from said surface of said chuck stage of said in-chuck probes are different in accordance with a distance of said in-chuck probes from a center of said surface of said chuck stage from which said in-chuck probes protrude.

5. The evaluation apparatus for a semiconductor device according to claim 1, wherein
    said in-chuck probes are equally disposed on said chuck stage.

6. The evaluation apparatus for a semiconductor device according to claim 1, wherein
    said in-chuck probes protruding in said normal direction from said surface of said chuck stage at said peripheral part of said surface of said chuck stage are more densely disposed than said in-chuck probes protruding in said normal direction from said surface of said chuck stage at a part of said surface of said chuck stage other than said peripheral part.

7. The evaluation apparatus for a semiconductor device according to claim 1, wherein
    said chuck stage is formed of a metal member.

8. The evaluation apparatus for a semiconductor device according to claim 1, wherein
    said chuck stage is formed of a resin member.

9. The evaluation apparatus for a semiconductor device according to claim 1, further comprising
    metal cylindrical members, each of the metal cylindrical members being formed at at least a part of an inner wall of each of said probe holes.

10. The evaluation apparatus for a semiconductor device according to claim 1, wherein
    each of said in-chuck probes includes:
        a rod-shaped plunger part; and
        a spring part provided along said plunger part,
    said plunger part has a plunger thick part having a larger diameter than other part, and
    said spring part has a first end that comes into contact with said plunger thick part, and a second end that comes into contact with a bottom of said probe hole.

11. The evaluation apparatus for a semiconductor device according to claim 10, wherein
    a length of said spring part in at least one of said in-chuck probes is different from a length of said spring part in at least one other of said in-chuck probes.

12. The evaluation apparatus for a semiconductor device according to claim 10, wherein
    a length of said plunger part in at least one of said in-chuck probes is different from a length of said plunger part in at least one other of said in-chuck probes.

13. The evaluation apparatus for a semiconductor device according to claim 10, wherein
    a position of said plunger thick part in a longitudinal direction of said plunger part is changeable.

14. An evaluation apparatus for a semiconductor device comprising:
    a chuck stage that has a surface on which a plurality of probe holes are formed and sucks a semiconductor device; and
    a plurality of in-chuck probes that have first ends which are inserted into the respective probe holes, and second ends which protrude from said surface of said chuck stage in a direction normal to said surface of said chuck stage, and come into contact with an arrangement surface of said semiconductor device arranged in said chuck stage, wherein a maximum extendable protrusion height from said surface of said chuck stage of at least one of said in-chuck probes is different from a maximum extendable protrusion height from said surface of said chuck stage of at least one other of said in-chuck probes, wherein
each of said in-chuck probes includes:
a rod-shaped plunger part; and
a spring part provided along said plunger part,
said plunger part has a plunger thick part having a larger diameter than other part,
said spring part has a first end that comes into contact with said plunger thick part, and a second end that comes into contact with a bottom of said probe hole, and wherein
the evaluation apparatus for a semiconductor further comprises spacers, each of the spacers being disposed in an end or both ends of said spring part.

15. The evaluation apparatus for a semiconductor device according to claim 10, wherein
contact parts provided in ends coming into contact with said semiconductor device, of said plunger parts, have protruding shapes.

16. The evaluation apparatus for a semiconductor device according to claim 10, wherein
contact parts provided in ends coming into contact with said semiconductor device, of said plunger parts, have planar shapes.

17. The evaluation apparatus for a semiconductor device according to claim 10, wherein
an end opposite to the end coming into contact with said semiconductor device of said plunger part is electrically connected to an external wiring line.

18. The evaluation apparatus for a semiconductor device according to claim 17, wherein
a plurality of said wiring lines are concentrated at a single place below said chuck stage.

19. The evaluation apparatus for a semiconductor device according to claim 17, wherein
a plurality of said wiring lines are concentrated at a plurality of places below said chuck stage, and thereafter further concentrated at a single place.

20. The evaluation apparatus for a semiconductor device according to claim 1, further comprising
counterbored parts formed to surround said probe holes in plan view, in said surface of said chuck stage.

21. The evaluation apparatus for a semiconductor device according to claim 20, wherein
a bottom of each of said counterbored parts has such a tapered shape as to deepen as separated from said probe hole.

22. An evaluation apparatus for a semiconductor device comprising:
a chuck stage that has a surface on which a plurality of probe holes are formed and sucks a semiconductor device; and
a plurality of in-chuck probes that have first ends which are inserted into the respective probe holes, and second ends which protrude from said surface of said chuck stage, and come into contact with an arrangement surface of said semiconductor device arranged in said chuck stage, wherein
a height protruding from said surface of said chuck stage of at least one of said in-chuck probes is different from a height protruding from said surface of said chuck stage of other said in-chuck probe,
said evaluation apparatus for a semiconductor device further comprising
counterbored parts formed to surround said probe holes in plan view, in said surface of said chuck stage, wherein said chuck stage includes:
a body part corresponding to said surface of said chuck stage;
an inner frame part corresponding to bottoms of said probe holes formed in said surface of said chuck stage; and
an outer frame part having hollow inside and connected to said inner frame part.

23. The evaluation apparatus for a semiconductor device according to claim 22, further comprising
counterbored suction holes, each of the counterbored suction holes being formed at at least a part of the bottom of said counterbored part, and penetrating said body part and said inner frame part.

24. The evaluation apparatus for a semiconductor device according to claim 22, further comprising:
a plurality of suction grooves formed in said surface of said chuck stage; and
suction holes, at least one of the suction holes being formed in a bottom surface of each of said suction grooves, and penetrating said body part and said inner frame part.

25. The evaluation apparatus for a semiconductor device according to claim 24, wherein
a plurality of said suction grooves are connected at at least one portion.

26. The evaluation apparatus for a semiconductor device according to claim 24, wherein
said suction grooves at a peripheral part of said surface of said chuck stage are more densely disposed than said suction grooves at a part of said surface of said chuck stage other than said peripheral part.

27. The evaluation apparatus for a semiconductor device according to claim 24, wherein
said suction grooves at a peripheral part of said surface of said chuck stage are more coarsely disposed than said suction grooves at a part of said surface of said chuck stage other than said peripheral part.

28. An evaluation method for a semiconductor device comprising
performing evaluation using an evaluation apparatus, the evaluation apparatus including:
a chuck stage that has a surface on which a plurality of probe holes are formed and sucks a semiconductor device; and
a plurality of in-chuck probes that have first ends which are inserted into the respective probe holes, and second ends which protrude from said surface of said chuck stage in a direction normal to said surface of said chuck stage, and come into contact with an arrangement surface of said semiconductor device arranged in said chuck stage, wherein
maximum extendable protrusion heights from said surface of said chuck stage of said in-chuck probes monotonically change with a distance from a center of said surface of said chuck stage to a peripheral part of said surface of said chuck stage.

\* \* \* \* \*